United States Patent
Legein et al.

(10) Patent No.: US 8,852,693 B2
(45) Date of Patent: Oct. 7, 2014

(54) COATED ELECTRONIC DEVICES AND ASSOCIATED METHODS

(75) Inventors: Filip Legein, Oudenaarde (BE); Anthony Vanlandeghem, Oudenaarde (BE); Peter Martens, Oudenaarde (BE)

(73) Assignee: Liquipel IP LLC, Santa Ana, CA (US)

( * ) Notice: Subject to any disclaimer, the term of this patent is extended or adjusted under 35 U.S.C. 154(b) by 180 days.

(21) Appl. No.: 13/111,688

(22) Filed: May 19, 2011

(65) Prior Publication Data
US 2012/0296032 A1 Nov. 22, 2012

(51) Int. Cl.
| B05D 7/24 | (2006.01) |
| C08F 2/46 | (2006.01) |
| C23C 16/00 | (2006.01) |
| C08L 27/12 | (2006.01) |
| C23C 16/50 | (2006.01) |
| B05D 5/08 | (2006.01) |
| C23C 16/02 | (2006.01) |
| H05K 5/02 | (2006.01) |
| C09D 133/16 | (2006.01) |
| B05D 1/00 | (2006.01) |

(52) U.S. Cl.
CPC .............. *H05K 5/0243* (2013.01); *C23C 16/50* (2013.01); *B05D 5/083* (2013.01); *C23C 16/0227* (2013.01); *C09D 133/16* (2013.01); *B05D 1/62* (2013.01)
USPC .............................. 427/488; 118/728; 524/544

(58) Field of Classification Search
CPC ........ C08L 27/12; D06M 15/277; A23F 3/34; B05D 1/62; B05D 5/083; C09D 133/16; C23C 16/0227; C23C 16/50

USPC .......................................... 427/488; 118/728
See application file for complete search history.

(56) References Cited

U.S. PATENT DOCUMENTS

| 1,761,229 A | 6/1930 | Pedersen |
| 1,999,762 A | 4/1935 | Howard et al. |
| 3,102,103 A | 8/1963 | Ahlbrecht et al. |
| 3,376,211 A | 4/1968 | Bjornsoo et al. |
| 3,409,695 A | 11/1968 | Sennewald |
| 3,457,156 A | 7/1969 | Fisher et al. |
| 3,622,493 A | 11/1971 | Crusco |
| 3,674,667 A | 7/1972 | Manion et al. |

(Continued)

FOREIGN PATENT DOCUMENTS

| AU | 665004 B2 | 12/1995 |
| AU | 6106899 A | 4/2000 |

(Continued)

OTHER PUBLICATIONS

Tahara et al.: "Washing durability of cotton and wool fabrics treated by plasma polymerization of perfluorocarbons," J. of the textile machinery society of Japan, Nihon Sen'l Kikai Gakkaishi, Osaka, JP, v. 49, No. 7, Jan. 1, 1996, pp. 37-45 and 56-64.

*Primary Examiner* — Dah-Wei D Yuan
*Assistant Examiner* — Kristen A Dagenais
(74) *Attorney, Agent, or Firm* — Dardi & Herbert, PLLC.; Curtis B. Herbert

(57) ABSTRACT

The present disclosure provides an electronic device and related method, wherein the device has a polymeric coating with low toxicity. The polymeric coating formed by exposing the electronic device to continuous plasma comprising a compound of $CH_2=C(R_1)-COO-R_2$, where $R_1$ includes —H or —$CH_3$; and where $R_2$ includes —$(CH_2)_2$—$(CF_2)_m$—$CF_3$ and m is 3 or 5.

26 Claims, 2 Drawing Sheets

(56) References Cited

U.S. PATENT DOCUMENTS

| | | | |
|---|---|---|---|
| 3,917,479 A | 11/1975 | Sayce et al. | |
| 4,125,152 A | 11/1978 | Kestner et al. | |
| 4,188,426 A | 2/1980 | Auerbach | |
| 4,336,311 A | 6/1982 | Lucey | |
| 4,377,619 A | 3/1983 | Schonhorn et al. | |
| 4,421,843 A | 12/1983 | Hattori et al. | |
| 4,433,111 A | 2/1984 | Tighe et al. | |
| 4,466,198 A | 8/1984 | Doll | |
| 4,473,379 A | 9/1984 | Liu | |
| 4,507,539 A | 3/1985 | Sando et al. | |
| 4,536,179 A | 8/1985 | Anderson et al. | |
| 4,628,006 A | 12/1986 | Rathbun et al. | |
| 4,649,071 A | 3/1987 | Tajima et al. | |
| 4,683,367 A | 7/1987 | Drouet | |
| 4,693,799 A | 9/1987 | Yanagihara et al. | |
| 4,778,721 A | 10/1988 | Sliemers et al. | |
| 4,791,012 A | 12/1988 | D'Agostino et al. | |
| 4,810,326 A | 3/1989 | Babu et al. | |
| 4,824,444 A | 4/1989 | Nomura | |
| 4,824,753 A | 4/1989 | Hotomi et al. | |
| 4,827,870 A | 5/1989 | Lee | |
| 4,831,944 A | 5/1989 | Durand et al. | |
| 4,836,136 A | 6/1989 | Natsuhara | |
| 4,842,989 A | 6/1989 | Taniguchi et al. | |
| 4,846,101 A | 7/1989 | Montgomery et al. | |
| 4,847,466 A | 7/1989 | Pasquini et al. | |
| 4,856,970 A | 8/1989 | Oda et al. | |
| 4,938,995 A | 7/1990 | Giordano et al. | |
| 4,996,694 A | 2/1991 | Santen et al. | |
| 5,002,794 A | 3/1991 | Ratner et al. | |
| 5,041,304 A | 8/1991 | Kusano et al. | |
| 5,061,304 A | 10/1991 | Gorzegno et al. | |
| 5,087,270 A | 2/1992 | Gateau et al. | |
| 5,091,204 A | 2/1992 | Ratner et al. | |
| 5,123,941 A | 6/1992 | Lauren et al. | |
| 5,137,780 A | 8/1992 | Nichols et al. | |
| 5,138,806 A | 8/1992 | Marx et al. | |
| 5,156,919 A | 10/1992 | Brar et al. | |
| 5,181,795 A | 1/1993 | Circeo, Jr. et al. | |
| 5,223,308 A | 6/1993 | Doehler | |
| 5,290,378 A | 3/1994 | Kusano et al. | |
| 5,298,587 A * | 3/1994 | Hu et al. | 528/10 |
| 5,308,742 A | 5/1994 | Ta | |
| 5,319,176 A | 6/1994 | Alvi et al. | |
| 5,328,576 A | 7/1994 | Paskalov et al. | |
| 5,336,518 A | 8/1994 | Narayanan et al. | |
| 5,348,632 A | 9/1994 | Jost | |
| 5,429,808 A | 7/1995 | Kuroda et al. | |
| 5,508,084 A | 4/1996 | Reeves et al. | |
| 5,514,276 A | 5/1996 | Babcock et al. | |
| 5,516,561 A | 5/1996 | Thomas | |
| 5,535,234 A | 7/1996 | Bullmann | |
| 5,593,550 A | 1/1997 | Stewart et al. | |
| 5,622,773 A | 4/1997 | Reiner et al. | |
| 5,643,638 A | 7/1997 | Otto et al. | |
| 5,657,706 A | 8/1997 | Liagre et al. | |
| 5,677,010 A | 10/1997 | Esser et al. | |
| 5,719,371 A | 2/1998 | Spariat | |
| 5,773,098 A | 6/1998 | Thomas | |
| 5,853,894 A | 12/1998 | Brown | |
| 5,856,380 A | 1/1999 | Bauer et al. | |
| 5,876,753 A | 3/1999 | Timmons et al. | |
| 6,037,560 A | 3/2000 | Titus et al. | |
| 6,129,956 A | 10/2000 | Morra et al. | |
| 6,155,182 A | 12/2000 | Tsangaris et al. | |
| 6,283,066 B1 | 9/2001 | Nurmi | |
| 6,444,275 B1 | 9/2002 | Kuhman et al. | |
| 6,532,768 B1 | 3/2003 | Labrot et al. | |
| 6,551,950 B1 | 4/2003 | Badyal et al. | |
| 6,663,713 B1 | 12/2003 | Robles et al. | |
| 6,755,211 B1 | 6/2004 | O'Connor et al. | |
| 7,051,459 B1 | 5/2006 | Wigutow | |
| 7,267,847 B2 | 9/2007 | Karamuk | |
| 7,413,774 B2 | 8/2008 | Kobrin et al. | |
| 7,523,787 B2 | 4/2009 | Richards et al. | |
| 7,638,167 B2 | 12/2009 | Kobrin et al. | |
| 7,695,638 B2 | 4/2010 | Nakamura et al. | |
| 7,695,775 B2 | 4/2010 | Kobrin et al. | |
| 7,776,396 B2 | 8/2010 | Kobrin et al. | |
| 7,879,396 B2 | 2/2011 | Kobrin et al. | |
| 7,968,154 B2 | 6/2011 | Ward | |
| 7,968,187 B2 | 6/2011 | Chinn et al. | |
| 8,029,872 B2 | 10/2011 | Ward | |
| 8,067,258 B2 | 11/2011 | Chinn et al. | |
| 8,071,160 B2 | 12/2011 | Chinn et al. | |
| 8,163,356 B2 | 4/2012 | Coulson | |
| 8,178,162 B2 | 5/2012 | Kobrin et al. | |
| RE43,651 E | 9/2012 | Badyal et al. | |
| 8,389,070 B2 | 3/2013 | Coulson et al. | |
| 2002/0134580 A1 | 9/2002 | Hedler et al. | |
| 2002/0151604 A1 | 10/2002 | Detering et al. | |
| 2003/0024806 A1 | 2/2003 | Foret | |
| 2003/0077435 A1 | 4/2003 | Charkoudian et al. | |
| 2003/0170454 A1 | 9/2003 | Lamotte et al. | |
| 2004/0046165 A1 | 3/2004 | Hunze et al. | |
| 2004/0086717 A1 | 5/2004 | Sasaki et al. | |
| 2004/0152381 A1 | 8/2004 | York et al. | |
| 2004/0251241 A1 | 12/2004 | Blutke et al. | |
| 2004/0265602 A1 | 12/2004 | Kobayashi et al. | |
| 2005/0034330 A1 | 2/2005 | Baychar | |
| 2005/0102851 A1 | 5/2005 | He et al. | |
| 2005/0106335 A1 | 5/2005 | Badyal et al. | |
| 2005/0271893 A1 | 12/2005 | Kobrin et al. | |
| 2006/0001700 A1 | 1/2006 | Bertelsen et al. | |
| 2006/0040053 A1 | 2/2006 | Gleason et al. | |
| 2006/0088666 A1 | 4/2006 | Kobrin et al. | |
| 2006/0213441 A1 | 9/2006 | Kobrin et al. | |
| 2007/0020392 A1 | 1/2007 | Kobrin et al. | |
| 2007/0062270 A1 | 3/2007 | Misra et al. | |
| 2007/0181703 A1 | 8/2007 | Buchanan et al. | |
| 2007/0266633 A1 | 11/2007 | Tsangaris et al. | |
| 2007/0272131 A1 | 11/2007 | Carabin et al. | |
| 2007/0281492 A1 | 12/2007 | Chinn et al. | |
| 2008/0081151 A1 | 4/2008 | Kobrin et al. | |
| 2008/0131623 A1 | 6/2008 | Zhang et al. | |
| 2008/0241512 A1 * | 10/2008 | Boris et al. | 428/328 |
| 2008/0248263 A1 | 10/2008 | Kobrin | |
| 2008/0257260 A9 * | 10/2008 | Brailove et al. | 118/719 |
| 2009/0077887 A1 | 3/2009 | Michon et al. | |
| 2009/0107713 A1 | 4/2009 | Chinn et al. | |
| 2009/0110819 A1 | 4/2009 | Chinn et al. | |
| 2009/0110884 A1 | 4/2009 | Chinn et al. | |
| 2009/0170391 A1 | 7/2009 | Coulson | |
| 2009/0263581 A1 | 10/2009 | Martin, III et al. | |
| 2009/0263641 A1 | 10/2009 | Martin, III et al. | |
| 2009/0286435 A1 | 11/2009 | Badyal et al. | |
| 2009/0304549 A1 | 12/2009 | Coulson | |
| 2009/0311442 A1 | 12/2009 | Legein et al. | |
| 2010/0035039 A1 | 2/2010 | Jing et al. | |
| 2010/0065781 A1 | 3/2010 | Brothier | |
| 2010/0075034 A1 | 3/2010 | Kobrin et al. | |
| 2010/0080957 A1 | 4/2010 | Chinn et al. | |
| 2010/0136246 A1 | 6/2010 | Badyal et al. | |
| 2010/0179370 A1 | 7/2010 | Clercq-Roques et al. | |
| 2010/0183879 A1 | 7/2010 | Coulson | |
| 2010/0189914 A1 | 7/2010 | Coulson | |
| 2010/0192414 A1 | 8/2010 | Coulson | |
| 2010/0203347 A1 | 8/2010 | Coulson | |
| 2010/0234524 A1 | 9/2010 | Coulson | |
| 2010/0236479 A1 | 9/2010 | Coulson | |
| 2010/0239742 A1 | 9/2010 | Larson-Smith et al. | |
| 2010/0243063 A1 | 9/2010 | Woodcock | |
| 2010/0255181 A1 | 10/2010 | Hopper | |
| 2010/0282693 A1 | 11/2010 | Coulson et al. | |
| 2010/0293812 A1 | 11/2010 | Coulson | |
| 2010/0304132 A1 | 12/2010 | Kobrin et al. | |
| 2010/0314575 A1 | 12/2010 | Gao et al. | |
| 2011/0027457 A1 | 2/2011 | Woodcock | |
| 2011/0114555 A1 | 5/2011 | Coulson et al. | |
| 2011/0236594 A1 | 9/2011 | Haverkamp et al. | |
| 2011/0259455 A1 | 10/2011 | King | |
| 2011/0262740 A1 | 10/2011 | Martin, III et al. | |
| 2011/0284504 A1 | 11/2011 | Michon et al. | |
| 2011/0303156 A1 | 12/2011 | Sikka et al. | |

(56) References Cited

U.S. PATENT DOCUMENTS

| | | | |
|---|---|---|---|
| 2012/0004367 A1 | 1/2012 | Imoto et al. |
| 2012/0009396 A1 | 1/2012 | Sikka et al. |
| 2012/0045954 A1 | 2/2012 | Bleecher et al. |
| 2012/0051018 A1 | 3/2012 | Ollgaard |
| 2012/0135163 A1 | 5/2012 | Ollgaard |
| 2012/0202353 A1 | 8/2012 | Ditizio et al. |
| 2012/0258025 A1 | 10/2012 | Coulson |
| 2012/0296032 A1 | 11/2012 | Legein et al. |
| 2012/0308762 A1 | 12/2012 | Legein et al. |
| 2013/0040102 A1 | 2/2013 | Gleason et al. |
| 2013/0211004 A1 | 8/2013 | Coulson |

FOREIGN PATENT DOCUMENTS

| | | |
|---|---|---|
| AU | 738802 B2 | 9/2001 |
| AU | 749176 B2 | 6/2002 |
| AU | 749438 B2 | 6/2002 |
| AU | 2003303816 A1 | 8/2004 |
| AU | 2005224155 A1 | 9/2005 |
| AU | 2007206778 A1 | 7/2007 |
| AU | 2007206779-A11 | 7/2007 |
| AU | 2007206781-A11 | 7/2007 |
| AU | 2007316012 A1 | 5/2008 |
| AU | 2008277496 A1 | 1/2009 |
| AU | 2008277499 A1 | 1/2009 |
| AU | 2008303379 A | 4/2009 |
| AU | 2008303385 A1 | 4/2009 |
| AU | 2008320636 A1 | 5/2009 |
| AU | 2009254992 A1 | 12/2009 |
| AU | 2009306194 A1 | 4/2010 |
| BR | 0318063 A | 12/2005 |
| CA | 2334631 A1 | 12/1999 |
| CA | 2338538 A1 | 2/2000 |
| CA | 2507881 A1 | 8/2004 |
| CA | 2559946 A1 | 9/2005 |
| CA | 2637478 A1 | 7/2007 |
| CA | 2637625-A11 | 7/2007 |
| CA | 2637733 A1 | 7/2007 |
| CA | 2667226 A1 | 5/2008 |
| CA | 2693397 A1 | 1/2009 |
| CA | 2693399 A1 | 1/2009 |
| CA | 2693825 A1 | 1/2009 |
| CA | 2699775 A1 | 4/2009 |
| CA | 2700491 A1 | 4/2009 |
| CA | 2703829 A1 | 5/2009 |
| CA | 2724894 A1 | 12/2009 |
| CA | 2740450 A1 | 4/2010 |
| CN | 1190545 A | 8/1998 |
| CN | 1312870 A | 9/2001 |
| CN | 1320062 A | 10/2001 |
| CN | 1946488 A | 4/2007 |
| CN | 101370877 A1 | 2/2009 |
| CN | 101370878 A | 2/2009 |
| CN | 101611100 A | 12/2009 |
| CN | 101743071 A | 6/2010 |
| CN | 101743353 A | 6/2010 |
| CN | 101743354 A | 6/2010 |
| CN | 101802258 A | 8/2010 |
| CN | 101809189 A | 8/2010 |
| CN | 101848758 A | 9/2010 |
| CN | 101945711 A | 1/2011 |
| CN | 102046261 A | 5/2011 |
| CN | 102203315 A | 9/2011 |
| DE | 3522817 | 1/1987 |
| DE | 3921652 | 1/1991 |
| DE | 4035049 | 5/1991 |
| DE | 4318084 | 12/1994 |
| DE | 102005004912 | 8/2006 |
| DE | 102006051656 | 5/2008 |
| EP | 0021601 | 1/1981 |
| EP | 0049884 A1 | 4/1982 |
| EP | 0120316 | 10/1984 |
| EP | 0127149 | 12/1984 |
| EP | 0153235 | 8/1985 |
| EP | 197694 | 10/1986 |
| EP | 0264227 | 4/1988 |
| EP | 0265051 | 4/1988 |
| EP | 0565420 | 10/1993 |
| EP | 0590467 | 4/1994 |
| EP | 0622111 A1 | 11/1994 |
| EP | 0816096 A2 | 1/1998 |
| EP | 0896035 A2 | 2/1999 |
| EP | 0939145 A1 | 9/1999 |
| EP | 1090178 A | 4/2001 |
| EP | 1104341 A1 | 6/2001 |
| EP | 1128912 A1 | 9/2001 |
| EP | 1557489 A1 | 7/2005 |
| EP | 1587862 A | 10/2005 |
| EP | 1643005 | 4/2006 |
| EP | 1729894 A1 | 12/2006 |
| EP | 1976941 A1 | 10/2008 |
| EP | 1976942-A11 | 10/2008 |
| EP | 1977035 | 10/2008 |
| EP | 1977035 A1 | 10/2008 |
| EP | 2087050 | 8/2009 |
| EP | 2087050 A1 | 8/2009 |
| EP | 2167245 A2 | 3/2010 |
| EP | 2167724 A1 | 3/2010 |
| EP | 2167725 A1 | 3/2010 |
| EP | 2207912 | 7/2010 |
| EP | 2207912 A2 | 7/2010 |
| EP | 2209930 | 7/2010 |
| EP | 2209930 A1 | 7/2010 |
| EP | 2252409 A2 | 11/2010 |
| EP | 2275598 A1 | 1/2011 |
| EP | 2296779 A2 | 3/2011 |
| EP | 2346678 | 7/2011 |
| EP | 2361321 A2 | 8/2011 |
| EP | 2390012 A2 | 11/2011 |
| ES | 2293568 T3 | 3/2008 |
| GB | 1565521 A | 4/1980 |
| GB | 2053026 | 2/1981 |
| GB | 2143910 A | 2/1985 |
| GB | 2160219 | 12/1985 |
| GB | 2354249 A | 3/2001 |
| GB | 2358635 A | 8/2001 |
| GB | 2365437 A | 2/2002 |
| GB | 2427407 A | 12/2006 |
| GB | 2432379 A | 5/2007 |
| GB | 2434368 A | 7/2007 |
| GB | 2434379 A | 7/2007 |
| GB | 2438195 A | 11/2007 |
| GB | 2443322 A | 4/2008 |
| GB | 2451175 A | 1/2009 |
| GB | 2451176 A | 1/2009 |
| GB | 2454242 A | 5/2009 |
| GB | 2454333 A | 5/2009 |
| GB | 2462159 A | 2/2010 |
| GB | 2463427 A | 3/2010 |
| GB | 246593 | 6/2010 |
| GB | 2465931 A | 6/2010 |
| GB | 2467276 A | 7/2010 |
| GB | 2469599 A | 10/2010 |
| GB | 2475685 A | 6/2011 |
| GB | 2477022 A | 7/2011 |
| HK | 1087139 A1 | 1/2008 |
| JP | 57119906 A | 7/1982 |
| JP | 58194131 | 11/1983 |
| JP | 59222340 A | 12/1984 |
| JP | 6013065 | 1/1985 |
| JP | 60260628 | 12/1985 |
| JP | 615422 | 1/1986 |
| JP | 61133239 | 6/1986 |
| JP | 61146702 | 7/1986 |
| JP | 6267720 | 3/1987 |
| JP | 6328855 | 2/1988 |
| JP | 6375002 | 4/1988 |
| JP | 63153750 | 6/1988 |
| JP | 63192867 | 8/1988 |
| JP | 63236515 | 10/1988 |
| JP | 63291052 | 11/1988 |
| JP | 63311794 A | 12/1988 |
| JP | 02061176 A | 3/1990 |

(56) References Cited

FOREIGN PATENT DOCUMENTS

| | | |
|---|---|---|
| JP | 2248245 | 10/1990 |
| JP | 711028 | 1/1995 |
| JP | 7153064 | 6/1995 |
| JP | 7263421 | 10/1995 |
| JP | 8272148 | 10/1996 |
| JP | 11036176 A | 2/1999 |
| JP | 345894 | 5/2000 |
| JP | 2003036996 | 2/2003 |
| JP | 2003513108 A | 4/2003 |
| JP | 2007529308 A | 10/2007 |
| JP | 4150001 B | 9/2008 |
| JP | 2009523914 A1 | 6/2009 |
| JP | 2009524510 A | 7/2009 |
| JP | 2009529611 A1 | 8/2009 |
| JP | 2010042410 A | 2/2010 |
| JP | 2010508162 A | 3/2010 |
| JP | 2010532727 A | 10/2010 |
| JP | 2010533530 A | 10/2010 |
| JP | 2010533793 A | 10/2010 |
| JP | 2010540765 A | 12/2010 |
| JP | 2010540766 A | 12/2010 |
| JP | 2011502745 A | 1/2011 |
| JP | 2011524799 A | 9/2011 |
| KR | 20070041673 A | 4/2007 |
| KR | 20080090518 A | 10/2008 |
| KR | 20080097201 | 11/2008 |
| KR | 20080098614 A1 | 11/2008 |
| KR | 20090082909 A | 7/2009 |
| KR | 20107003088 | 4/2010 |
| KR | 20100056464 A | 5/2010 |
| KR | 20100087127 A | 8/2010 |
| KR | 20100087128 A | 8/2010 |
| KR | 20100093051 A | 8/2010 |
| KR | 20110037976 A | 4/2011 |
| KR | 20110074615 A | 6/2011 |
| MX | PA05007915 A | 9/2005 |
| MX | PA06010611 A | 12/2006 |
| MX | 2008009092 A1 | 10/2008 |
| MX | 2010000646 A | 6/2010 |
| MX | 2010003142 A | 6/2010 |
| MX | 2010003143 A | 6/2010 |
| NO | 20053207 A | 7/2005 |
| NZ | 508750 A | 11/2002 |
| NZ | 509522 A | 11/2002 |
| NZ | 550498 A | 7/2010 |
| NZ | 570463 A | 10/2010 |
| NZ | 570462 A1 | 11/2010 |
| NZ | 576483 A | 12/2010 |
| NZ | 584693 A | 9/2011 |
| NZ | 584696 A | 9/2011 |
| NZ | 582765 A | 11/2011 |
| TW | 200800621 A | 1/2008 |
| TW | 200833797 A | 8/2008 |
| TW | 200912085 A | 3/2009 |
| TW | 200914470 A | 4/2009 |
| TW | 200924859 A | 6/2009 |
| TW | 200928230 A | 7/2009 |
| TW | 200928231 A | 7/2009 |
| TW | 200939286 A | 9/2009 |
| TW | 200940161 A | 10/2009 |
| TW | 200942316 A | 10/2009 |
| TW | 20100695 A3 | 2/2010 |
| TW | 201024449 A | 7/2010 |
| WO | 8600180 | 1/1986 |
| WO | 8911836 | 12/1989 |
| WO | WO-9210310 A1 | 6/1992 |
| WO | WO-9304763 A1 | 3/1993 |
| WO | 9404631 | 3/1994 |
| WO | WO-9504854 A2 | 2/1995 |
| WO | 9631792 | 10/1996 |
| WO | 9718415 | 5/1997 |
| WO | WO-9738801 A1 | 10/1997 |
| WO | WO-9858117 A1 | 12/1998 |
| WO | WO-9932235 A1 | 7/1999 |
| WO | WO-9964662 A1 | 12/1999 |
| WO | WO-0005000 A1 | 2/2000 |
| WO | WO-0014296 A1 | 3/2000 |
| WO | WO-0020130 A1 | 4/2000 |
| WO | WO-0107144 A2 | 2/2001 |
| WO | WO-0189721 A1 | 11/2001 |
| WO | WO-0191909 A1 | 12/2001 |
| WO | WO-03090939 A1 | 11/2003 |
| WO | WO-2004067614 A1 | 8/2004 |
| WO | WO-2004088710 A2 | 10/2004 |
| WO | WO2005/006398 | 1/2005 |
| WO | WO-2005063069 A2 | 7/2005 |
| WO | WO 2005089961 A1 * | 9/2005 |
| WO | WO-2005089961 A1 | 9/2005 |
| WO | WO2005/121397 | 12/2005 |
| WO | 2006029642 | 3/2006 |
| WO | 2006096005 | 9/2006 |
| WO | WO2006/121573 | 11/2006 |
| WO | WO 2007/083122 | 7/2007 |
| WO | WO-2007083121 A1 | 7/2007 |
| WO | WO-2007083122 A1 | 7/2007 |
| WO | WO-2007083124 A1 | 7/2007 |
| WO | WO-2007092442 A1 | 8/2007 |
| WO | WO-2007135394 A1 | 11/2007 |
| WO | WO2008/053150 | 5/2008 |
| WO | WO-2008053150 A1 | 5/2008 |
| WO | WO 2008053150 A1 * | 5/2008 |
| WO | WO2008/123955 | 10/2008 |
| WO | WO2008/123961 | 10/2008 |
| WO | WO2008/143837 | 11/2008 |
| WO | WO2009/010741 | 1/2009 |
| WO | WO-2009010738 A1 | 1/2009 |
| WO | WO-2009040536 A1 | 4/2009 |
| WO | WO-2009040542 A2 | 4/2009 |
| WO | WO2009/058732 | 5/2009 |
| WO | WO2009/058735 | 5/2009 |
| WO | WO-2009056812 A1 | 5/2009 |
| WO | WO-2009060194 A2 | 5/2009 |
| WO | WO-2009087102 A2 | 7/2009 |
| WO | WO-2009101425 A2 | 8/2009 |
| WO | 2009144198 | 12/2009 |
| WO | 2009151492 | 12/2009 |
| WO | WO-2009147422 A2 | 12/2009 |
| WO | WO2010/042191 | 4/2010 |
| WO | WO2010/042668 | 4/2010 |
| WO | WO-2010046636 A2 | 4/2010 |
| WO | WO-2011064562 A2 | 6/2011 |
| WO | WO-2011086368 A2 | 7/2011 |
| WO | WO2011/116005 | 9/2011 |
| WO | 2013011315 | 1/2013 |
| WO | 2013024234 | 2/2013 |
| WO | 2013024235 | 2/2013 |
| ZA | 200806846 A1 | 11/2009 |
| ZA | 200806847 A | 12/2009 |
| ZA | 200902775 A | 5/2010 |
| ZA | 201000558 A | 10/2010 |

* cited by examiner

COATED ELECTRONIC DEVICES AND ASSOCIATED METHODS

BACKGROUND

Electronic devices are essentially three dimensional structures of electrically conductive and electrically insulating materials. Such electronic devices include not only equipment but also sub assemblies, printed circuit boards (PCBs), both bare and assembled, and individual components such as integrated circuits and transistors. The electrically conductive parts of such structures usually consist of metals such as copper, aluminum, silver, gold, conductive polymers, semiconductor materials, etc. The electrically non-conductive parts or insulators of these structures usually consist of polymers such as polyimide, polytetrafluoroethylene, silicone, or polyamide, with or without glass-fiber reinforcement, paper based materials, ceramics, glass, etc.

Throughout the lifetime of assembled electronic devices, they are subject to various forms of contamination. The conductivity of some of the materials may be reduced by atmospheric corrosion, and pollution can cause conductive paths to become established between adjacent traces or conductors. Additionally, electronic devices can often accidentally be submersed in various liquids, such as water, often destroying the function of the electronic device. As electronic devices are being used increasingly in more and more hostile and polluted environments, there has become a greater need to protect these items from damage when exposed to those environments.

SUMMARY

Accordingly, it has been recognized that there is need for coated electronic devices and methods that allow for protection of electronic devices from water or other moisture exposure, pollutants, and/or other contamination. As such, the present disclosure provides an electronic device having a polymeric coating with low toxicity. The polymeric coating can provide protection to the electronic device from the elements, and do so in a way that is safe to the user and the environment.

The polymeric coating can be formed by exposing the electronic device to continuous plasma of a monomer vapor with following structure:

$$CH_2=C(R_1)-COO-R_2$$

where $R_1$ includes —H or —$CH_3$; and where $R_2$ includes —$(CH_2)_2$—$(CF_2)_m$—$CF_3$ and m is 3 or 5. As such, the polymerized coating can comprise a compound selected from the group consisting of:

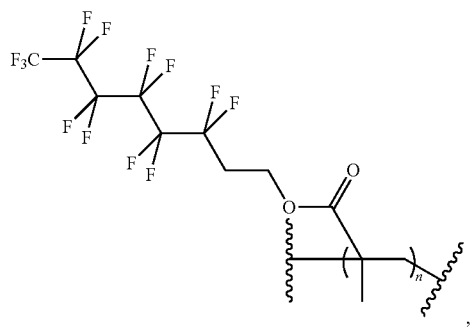

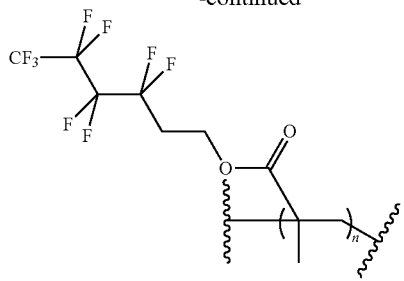

and mixtures thereof, wherein n is from 2 to 100,000.

Additionally, a method for protecting an electronic device against pollution and/or contamination (including water or other moisture exposure) using a polymeric coating with low toxicity can comprise: placing the electronic device in a plasma chamber; forming a continuous plasma in the plasma chamber; vaporizing a compound comprising $CH_2=C(R_1)-COO-R_2$, where $R_1$ is —H or —$CH_3$, and where $R_2$ is —$(CH_2)_2$—$(CF_2)_m$-$CF_3$ and m is 3 or 5; and contacting the vaporized compound with the plasma in the plasma chamber. With the electronic device in the chamber, the vaporized compound can polymerize on a surface of the electronic device, thereby forming the polymeric coating on the surface of the electronic device.

Additional features and advantages of the invention will be apparent from the detailed description which follows, taken in conjunction with the accompanying drawings, which together illustrate, by way of example, features of the invention.

DETAILED DESCRIPTION

Figure 1:
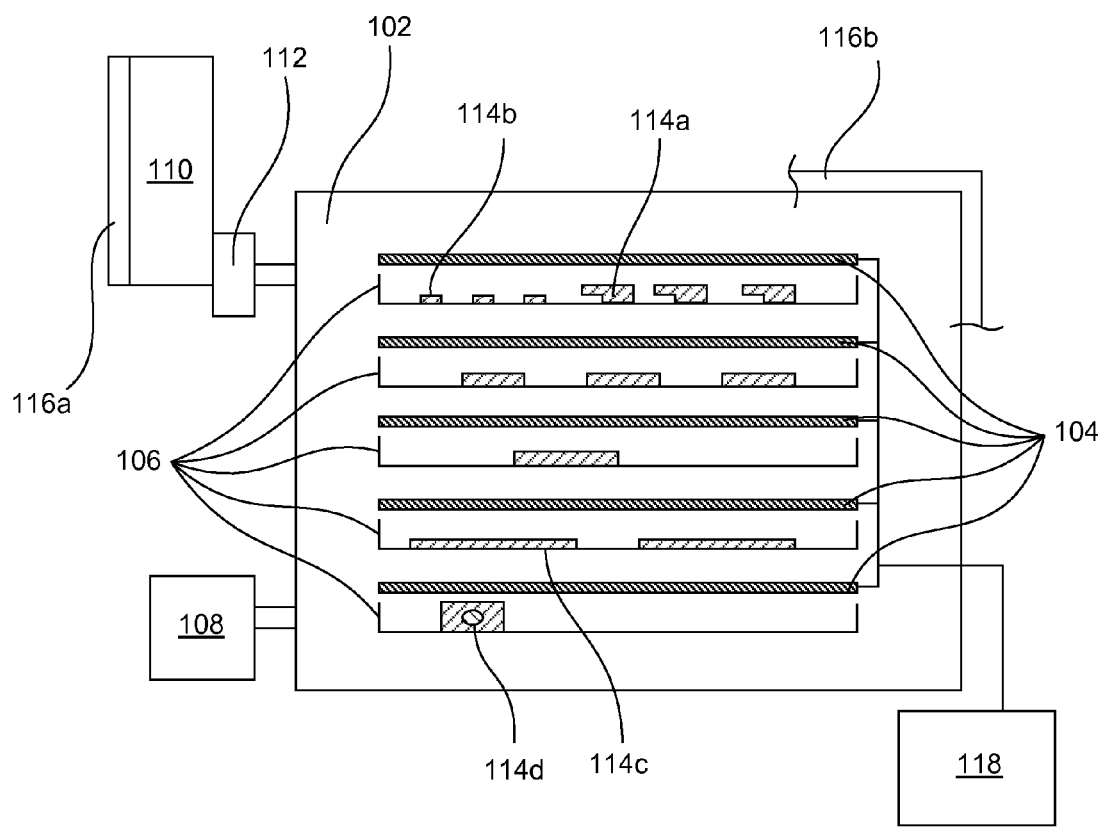
FIG. 1 is a schematic view of a coating apparatus in accordance with an example of the present disclosure.

Reference will now be made to the exemplary embodiments illustrated in the drawings, and specific language will be used herein to describe the same. It will nevertheless be understood that no limitation of the scope of the invention is thereby intended. Alterations and further modifications of the inventive features illustrated herein, and additional applications of the principles of the inventions as illustrated herein, which would occur to one skilled in the relevant art and having possession of this disclosure, are to be considered within the scope of the invention.

It is noted that, as used in this specification and the appended claims, the singular forms "a," "an," and "the" include plural referents unless the context clearly dictates otherwise.

As used herein, "oleophobicity" refers to the physical property of a molecule or compound that is repelled from oil as measured by ISO 14419:2010 by the International Organization for Standardization at the date of filing the present disclosure.

As used herein, "low toxicity" refers to having a perfluorooctane sulfonate (PFOS) level of less than 0.2 parts per billion (ppb) and perfluorooctanoic acid (PFOA) level of less than 0.4 parts per billion (ppb), unless otherwise stated.

As used herein, "free from PFOS and PFOA" refers to a material or polymeric coating having PFOS and PFOA below detectable limits. "Substantially free from PFOS and PFOA" refers to a material or polymeric coating having low levels of PFOS and/or low levels of PFOA so that the coating would be considered to have "low toxicity."

As used herein, "electronic device" refers to any device having an electronic component that is used by an end user or consumer. "Electronic device" does not mean individual electronics components per se used to make up an electronic device, such as circuits and circuit boards, etc., prior to assembly in the electronic device. Rather, an electronic device comprises individual components assembled together to form a finished consumer product (with or without the battery), such as a cellular phones, personal digital assistants (PDA), computers, tablet computers, music players, cameras, video recorders, e readers, radio devices, and gaming devices, including batteries thereof.

As used herein, "electronic component" refers to any physical entity in an electronic device used to affect the electrons or their associated fields in a desired manner consistent with the intended function of an electronic device.

As used herein, the term "about" is used to provide flexibility to a numerical range endpoint by providing that a given value may be "a little above" or "a little below" the endpoint. The degree of flexibility of this term can be dictated by the particular variable and would be within the knowledge of those skilled in the art to determine based on experience and the associated description herein.

As used herein, the term "substantially" or "substantial" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking, the nearness of completion will be so as to have the same overall result as if absolute and total completion were obtained.

Concentrations, amounts, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 10 to about 50" should be interpreted to include not only the explicitly recited values of about 10 to about 50, but also include individual values and sub-ranges within the indicated range. Thus, included in this numerical range are individual values such as 20, 30, and 40 and sub-ranges such as from 10-30, from 20-40, and from 30-50, etc. This same principle applies to ranges reciting only one numerical value. Furthermore, such an interpretation should apply regardless of the breadth of the range or the characteristics being described.

It has been discovered that certain coatings, such as conformal nan-coatings, can be used on electronic devices, providing protection of such devices from pollutants and contamination including water or moisture, or other liquid contamination. It has also been discovered that these coatings can be applied in a manner that is safe and effective for end users, and which are also generally environmentally friendly. The conformal coatings can provide an effective barrier between the device and the environment and the coating also be electrically insulating. The coating will typically prevent physical contamination, which may, for example, result in conductive growths across the non-conductive parts of the structure or installation, which can, in time, cause electric defects including, for example, short circuits. Other examples of contamination are dendrites that grow across surfaces under certain conditions and "whiskers" that can grow through the air between component leads. The coatings can also provide protection such that the metal does not oxidize in air or corrode in other environmental gasses. Other desirable conditions that the coating may protect from include high humidity, high temperature, and high pollution including dust, salts, acids, solvents, etc. Furthermore, the coatings of the present disclosure can also protect against accidental immersion or contact with water, e.g., dropping in body of water, exposure to rain, etc.

Traditional conformal coatings typically provide a coating that is on the order of micron in thickness and are generally removed prior to repairs or replacement of parts. In contrast, a conformal nano-coating produced by a plasma process using materials that are environmentally friendly can provide advantages over these systems. The present disclosure provides a plasma polymerization process where a thin polymeric film can be deposited on any surface that comes in contact with the plasma of an organic monomer, which can be created in the plasma chamber. Depending upon the deposition conditions, or plasma parameters, including power, pressure, temperature, flow, etc., the properties of the film may be adapted to the requirements of the applications of the electronic devices.

With this in mind, an electronic device can have a polymeric coating applied thereto, wherein the coating has low toxicity. The polymeric coating can be formed by exposing the electronic device to continuous plasma including the monomers described herein. Generally, for the present electronic devices, a conformal nano-coating can be applied by a low pressure plasma process, e.g., less than about 1000 mTorr. The typical layer of thickness for the coating can be from 5 nm to 500 nm. In one aspect, the coating can be from 25 nm to 250 nm. Notably, such coatings are fundamentally thinner than conformal coatings applied by some other processes. The present conformal nano-coating can provide a uniform coating, and can be especially useful for coating electronic devices, as the thickness can allow for penetration and coverage in small confinements at the surface of the electronic device, thereby preventing water, moisture, or other contamination to enter therein in many circumstances.

Generally the plasma process can be used in a vacuum plasma chamber where the parameters for controlling the plasma process include power, pressure, temperature, type of monomer, flow, frequency of the plasma generator, and process time. The frequency of the plasma generator can be in the kHz, MHz, and GHz range. Generally, the plasma frequency is continuous. In one embodiment, the frequency can range from about 20 kHz to about 2.45 GHz. In another aspect, the frequency can be from about 40 KHz to about 20 MHz. In another aspect, the frequency can be from about 12 MHz to about 15 MHz. In one specific aspect, the frequency can be about 13.5 to 13.6 MHz, e.g., 13.56 MHz.

Generally the pressure for the plasma process can be from about 10 mTorr to about 1000 mTorr. In one aspect, the pressure can be from about 10 mTorr to about 100 mTorr. In another aspect, the pressure can be from about 20 mTorr to about 60 mTorr.

The power used in the plasma process can dependent, in some degree, upon the monomer used. In one embodiment, the power can be from about 5 W to about 5000 W. In another aspect, the power can range from about 0.017 to 0.023 W per $cm^2$ of electrode. Generally, if the monomer is large and/or less stable, it may be too easily decomposed by high power and lower power may be more appropriate for use in the plasma process.

Generally, the plasma can be formed at any temperature that allows for reactivity of the plasma with the monomer but does not destroy the monomer. In one embodiment, the plasma can be formed at a temperature from about 5° C. to about 200° C. In one aspect, the temperature can be from about 20° C. to about 100° C. In addition to the temperature of the plasma, the walls of the plasma chamber can controlled such that the monomer does not condense thereon. Such control can include the heating the walls to a specific temperature. In one embodiment, the walls of the chamber can have a temperature from about 20° C. to about 200° C. In another aspect, the temperature can be from about 40° C. to about 50° C. Further, the monomer can be heated to a specific temperature to allow the monomer to vaporize into a gaseous state before inducing it into the plasma chamber or as it enters the plasma chamber. In one embodiment, the temperature of the monomer can be from 120° C. to about 200° C. In another aspect, the temperature can be from about 140° C. to about 150° C. These temperatures can apply to the monomer in the liquid state prior to vaporization, to the vapor state, or even the gaseous state. In addition to temperature, it is understood that pressure can be also used to transform the liquid monomer into a gaseous state prior to or during contact with the plasma. Also, monomers used in accordance with the present disclosure may be gaseous in general or, as outlined herein, may be made gaseous through the use of temperature and/or pressure. The monomers can comprise a compound having the following structure:

$$CH_2=C(R_1)-COO-R_2$$

where $R_1$ includes —H or —$CH_3$; and where $R_2$ includes —$(CH_2)_2$—$(CF_2)_m$—$CF_3$ and m is 3 or 5.

Such monomers and resulting the coatings of the present disclosure are generally friendlier to humans and the environment (e.g., lower toxicity) as compared to longer fluorinated monomers. Additionally, in one embodiment, such low toxicity can include having a perfluorooctane sulfonate (PFOS) level of less than 0.2 parts per billion (ppb) and perfluorooctanoic acid (PFOA) level of less than 0.4 parts per billion (ppb). In another embodiment, the levels of PFOS can be less than 0.1 parts per billion (ppb) and the levels of PFOA can be less than 0.2 parts per billion (ppb). In still another embodiment, the levels can be low enough that they are undetectable or absent, e.g., free from PFOS and PFOA which is defined to include being free from their precursors and/or related higher homologues (having carbon and/or fluorine from 1-100).

The coatings described herein can provide an oleophobicity level of at least 5. In one aspect the oleophobicity level can be at least 6. Additionally, the coating can provide a water contact angle of at least 100°. In one aspect, the coating can provide a water contact angle of at least 110°. Such characteristics of the coating can help protect against pollutants and contamination, including water or moisture contamination. In one embodiment, the coating can protect against liquid damage. In another aspect, the contamination or liquid damage can be water.

As discussed herein, the coating can be applied to any electronic device. In one embodiment, the electronic device can include cellular phones, personal digital assistants (PDA), music players, cameras, video recorders, computers, tablet computers, batteries, e readers, radio devices, and gaming devices. In one particular aspect the electronic device can be a cellular phone.

Turning now to FIG. 1, a coating apparatus 100 can include a plasma chamber 102 comprising electrodes 104 and trays 106 for holding various electronic devices, e.g., cell phones 114a, batteries 114b, tablet computers 114c, cameras 114d, etc. The plasma chamber can have a vacuum pump 108 connected thereto for controlling the pressure inside the plasma chamber. The electrodes can be connected to a power source 118 for controlling the power. The monomer can be present in a canister 110, either in gaseous, vapor, or liquid form. The monomer can then be introduced into the plasma chamber through control mechanism 112. In one embodiment, the control mechanism can be a control valve. The control mechanism generally controls the flow of the monomer into the plasma chamber. In one specific embodiment, the flow rate can be about 30 standard cubic centimeter per minute (sccm) to about 50 sccm for a plasma chamber having a volume of about 450 liter to about 550 liter with a pump capacity of about 500 m³/h, though this can be varied for achieving modified results as would be apparent to one skilled in the art after considering the present disclosure. As discussed herein also, the monomer can be heated with a heating unit 116a at the canister, additional heating can occur at the plasma chamber 116b. The specific device used for heating can be any heating device known in the art that would be functional for providing heating parameters described herein in practicing the principles of the present disclosure.

Figure 2:
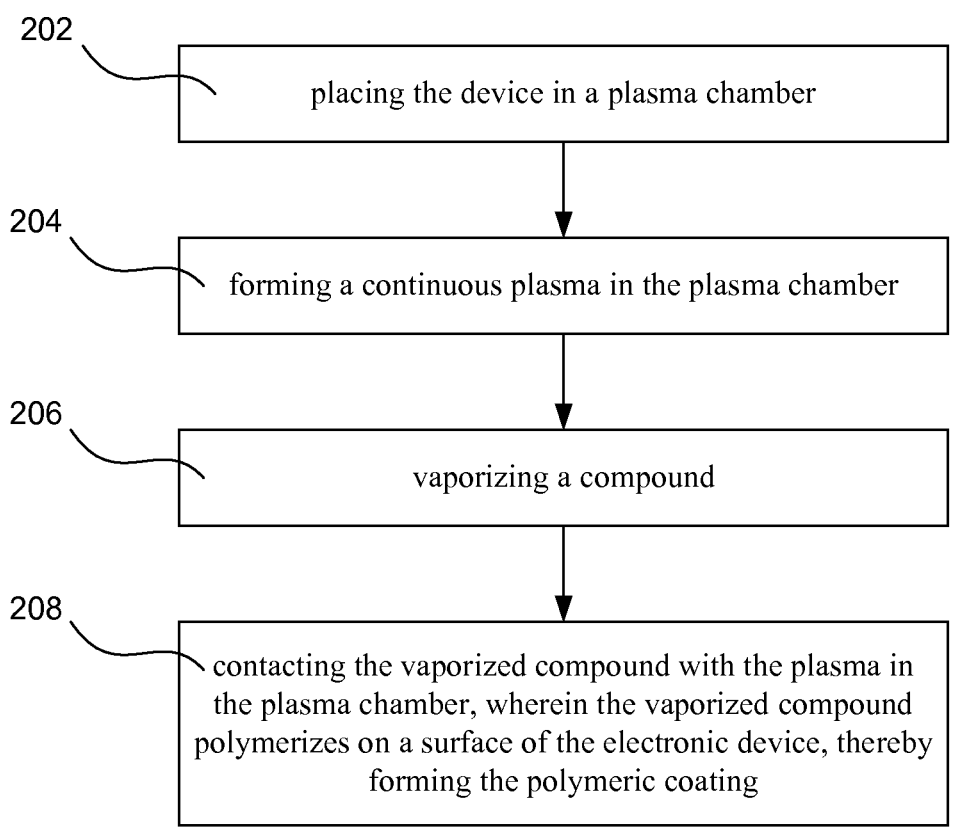
FIG. 2 is a flow chart of a method in accordance with an example of the present disclosure.

The plasma chamber generally defines a volume of space sufficient to house an electronic device for coating. In one embodiment, the plasma chamber can have a volume of about 0.1 ft³ to about 50 ft³. In another aspect, the volume can be about 15 ft³ to about 20 ft³. Even though the plasma chamber of FIG. 1 provides for a plurality of trays with electrodes in close proximity, other configurations are considered to be with the present scope. For example, the plasma chamber may comprise a single tray for placement of an electronic device with a single electrode for generation of the plasma, where the electrode is spaced substantially apart from the tray. It is understood that plasma can be generated to partially fill the plasma chamber or may fill the entire volume, or substantially entire volume, of the plasma chamber. Additionally, the electrodes can be orientated in varying configurations such that plasma can be generated over an area or volume as desired. FIG. 1 provides several trays each having electrodes capable of generating plasma sufficient to encompass the contents of each tray; however, as discussed above, other configurations are contemplated herein. Turning now to FIG. 2, a method 200 for protecting an electronic device against pollution and/or contamination using a polymeric coating with low toxicity can comprise: placing 202 the electronic device in a plasma chamber; forming 204 a continuous plasma in the plasma chamber; vaporizing 206 a compound with the following structure:

$$CH_2=C(R_1)-COO-R_2$$

where $R_1$ includes —H or —$CH_3$; and where $R_2$ includes —$(CH_2)_2$—$(CF_2)_m$—$CF_3$, and m is 3 or 5; and contacting 208 the vaporized compound with the plasma in the plasma chamber, wherein the vaporized compound polymerizes on a surface of the electronic device, thereby forming the polymeric coating. Additionally, in one embodiment, the method can further include lowering the pressure of the plasma chamber. Further, the method can include opening the device prior to coating the device (the electronic device can be assembled, partially assembled, or disassembled).

Generally, the vaporized compound polymerizes on a surface of the electronic device thereby forming a polymeric coating. In one embodiment, the polymeric coating can have the following structure:

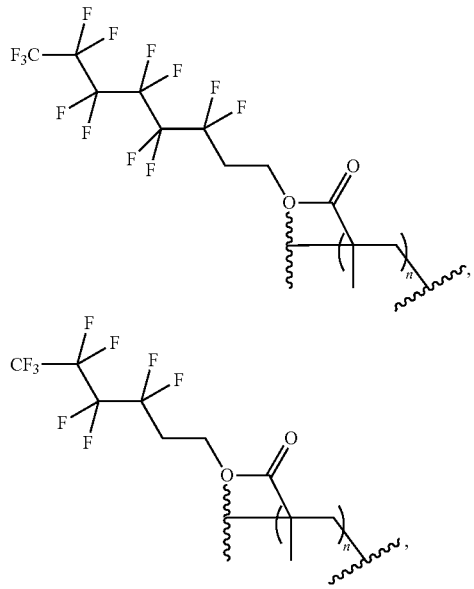

and mixtures thereof; where n is from 2 to 100,000.

The present coatings can be deposited upon the electronic device at varying rates depending upon the processing parameters. In one embodiment, the polymer forms at a rate of about 25 nm to about 75 nm per minute, or in a more specific embodiment, at a rate of about 50 nm per minute. While the present coatings can be used for any electronic device, in one embodiment, the electronic device can be a cellular phone or other electronic device with a battery, and the battery can be separated from the cellular phone or other device prior to placing the cellular phone in the plasma chamber. Furthermore, many cellular phones and other devices have water damage sensors hidden beneath the battery or elsewhere for manufacturers to determine whether an electronic device has been damaged by water (usually for warranty purposes). In accordance with embodiments of the present disclosure, the water damage sensor can also be coated with polymer, making water contact now possible without activating the sensor.

The present methods can further include cleaning and/or etching the electronic device prior to contacting the vaporized compound with the plasma. Such etching or cleaning can provide good adhesion between the coating and the component parts of the electronic device. Such adhesion can help maintaining the integrity of the coating throughout the life span of the electronic device. Generally, etching or cleaning removes organic material from the surfaces of the electronic device. With an electronic device with a viewing window, such as a cell phone, it may not be desirable to etch the surface; however, cleaning the surface may be perfectly appropriate when coating such devices. While cleaning generally involves the removal of organic material and other contaminants from the external and internal surfaces of the electronic device, etching may include partial removal, or roughening, of the surfaces of the electronic device.

The present low pressure plasma process can be particularly suitable for electronic devices as the reaction gasses, including the gaseous monomer, can permeate into openings of the three-dimensional structure. Such a process is distinct from liquid conformal coatings that are limited by surface tension. Additionally, the present process is also a dry process compared to traditional liquid processes.

Typical gases used for plasma cleaning or etching include $O_2$, $N_2$, $CF_4$, Ar, He, and mixtures thereof. The present cleaning or etching step can be performed prior to placing the electronic device in the plasma chamber or can be performed in the plasma chamber prior to coating the electronic device. In one aspect, the cleaning or etching can be performed in the plasma chamber prior to coating the electronic device, allowing for a more efficient and economical process. As mentioned, in many instances, cleaning will be more appropriate than etching in order to maintain the look of the electronic device, but in some more limited instances, etching may still be appropriate.

The present methods can further include activating the surface of the electronic device prior to contacting the vaporized compound with the plasma in the plasma chamber. Such activation can improve the bond between the coating and the surfaces of the electronic device. Activation generally includes the formation of chemical groups on the surfaces of the electronic device, both external and internal, which can increase the affinity of the surfaces for the coating. Typical gases used for activation include $O_2$, $N_2$, $N_2O$, $NH_3$, $H_2$, $CH_4$, $CF_4$, Ar, He, and mixtures thereof. The present activation step can be performed prior to placing the electronic device in the plasma chamber or can be performed in the plasma chamber prior to coating the electronic device. In one aspect, the activation can be performed in the plasma chamber prior to coating the electronic device allowing for a more efficient and economical process.

The present methods can further include degassing the electronic device prior to introducing the vaporized compound into the plasma chamber. Degassing can remove trapped gases or liquids allowing for improved bonding between the coating and the surfaces of the electronic device. Such degassing can allow the monomer and reaction gases to penetrate into the electronic device, or at least into openings on the surface of the electronic device (openings that would also be susceptible to leaks when submersed or exposed to water or moisture). The degassing can be performed in a single step or can be performed over a series of degassing cycles. As discussed herein, a vacuum can be used to reduce the pressure in the plasma chamber during the coating process. The vacuum can also be used in the degassing step. As such, the present degassing step can be performed prior to placing the electronic device in the plasma chamber or can be performed in the plasma chamber prior to coating the electronic device. In one aspect, the degassing can be performed in the plasma chamber prior to coating the electronic device allowing for a more efficient and economical process.

The present cleaning, etching, activation, and/or degassing steps can be achieved individually or in combination by the appropriate choice of process parameters and by use of appropriate materials. Additionally, heating may be used in combination with these steps as appropriate.

As discussed herein, vaporizing the monomer compound can occur in the plasma chamber or can occur outside the plasma chamber. Generally, the steps recited herein are not limited to the order presented but may be combined or reordered, unless otherwise stated. For example, an electronic device can be placed in the plasma chamber where the electronic device undergoes a cleaning step, an etching step, an activation step, and/or a degassing step, or can be placed in the plasma chamber followed by the cleaning/etching/activation/degassing step(s).

It is to be understood that the above-referenced arrangements are only illustrative of the application for the principles of the present invention. Numerous modifications and alternative arrangements can be devised without departing from the spirit and scope of the present invention. While the present invention has been shown in the drawings and fully described above with particularity and detail in connection with what is presently deemed to be the most practical and preferred embodiment(s) of the invention, it will be apparent to those of ordinary skill in the art that numerous modifications can be made without departing from the principles and concepts of the invention as set forth herein.

EXAMPLES

The following examples illustrate a number of variations of the present devices and methods that are presently known. However, it is to be understood that the following are only exemplary or illustrative of the application of the principles of the present disclosure. Numerous modifications and alternative devices and/or methods may be devised by those skilled in the art without departing from the spirit and scope of the present disclosure. The appended claims are intended to cover such modifications and arrangements. Thus, while the present electronic devices and methods have been described above with particularity, the following examples provide further detail in connection with what are presently deemed to be acceptable.

Example 1

Conformal Nano-Coating of Cellular Phone

A cellular phone is separated from its battery, and both are placed in a tray in a plasma chamber having dimensions 700 mm×730 mm×960 mm. The temperature walls of the plasma chamber are heated to 40-50° C. The temperature of the monomer in a canister is held at 150° C. prior to introduction to the plasma chamber. An etching gas of Ar is cycled through the plasma chamber followed by a degassing cycle for about 10 minutes. An electrode, having an area of 3416 cm², is powered to 75 W generating a continuous frequency of about 13.56 MHz. The plasma chamber is reduced in pressure to 20-50 mTorr prior to introduction of the monomer. The monomer with the following structure: $CH_2=C(R_1)-COO-R_2$, where $R_1$ is $-CH_3$ and where $R_2$ is $-(CH_2)_2-(CF_2)_m-CF_3$, with m being 5, is vaporized and introduced into the plasma chamber at rate of 50 sccm. The cellular phone and the battery are treated for about 2 minutes resulting in a uniform polymeric coating having a thickness of about 100 nm. The battery is re-inserted in the phone making sure the electrical contact between the two is established. The result is a phone and battery combination that is more water resistant than prior to treatment. Furthermore, the water damage sensor hidden beneath the battery also becomes coated with polymer, making water contact now possible without activating the sensor.

Example 2

Conformal Nano-Coating of Tablet Computer

A tablet computer is opened and placed in a tray in a plasma chamber having dimensions 700 mm×730 mm×960 mm. The temperature walls of the plasma chamber are heated to 40-50° C. The temperature of the monomer in a canister is held at 150° C. prior to introduction to the plasma chamber. An etching gas of Ar is cycled through the plasma chamber followed by a degassing cycle for about 10 minutes. An electrode, having an area of 3416 cm², is powered to 75 W generating a continuous frequency of about 13.56 MHz. The plasma chamber is reduced in pressure to 20-50 mTorr prior to introduction of the monomer. A monomer with the following structure: $CH_2=C(R_1)-COO-R_2$ where $R_1$ is $-CH_3$ and $R_2$ is $-(CH_2)_2-(CF_2)_m-CF_3$, with m is 5, is vaporized and introduced into the plasma chamber at rate of 50 sccm. The tablet computer is treated for about 4 minutes resulting in a uniform polymeric coating having a thickness of about 200 nm. The result is a tablet computer that is more water resistant than prior to treatment.

What is claimed is:

1. A method of coating a surface of an electronic device, comprising:
    exposing the surface of the electronic device to a plasma comprising a compound with the following chemical formula:

$$CH_2=C(R_1)-COO-R_2$$

where $R_1$ includes $-H$ or $CH_3$, $R_2$ includes $-(CH_2)_2-(CF_2)_m-CF_3$, and m is 3 or 5, so as to form a polymeric coating on the surface, the polymeric coating having an oleophobicity level of at least 5, and
    placing the electronic device in one of a plurality of trays in a plasma chamber wherein each tray is proximate to a proximate electrode wherein each electrode is connected to a power source, and generates plasma to encompass the contents of each tray,
    introducing the compound into the plasma chamber through a control mechanism,
    wherein the polymeric coating has a low toxicity level with perfluorooctane sulfonate (PFOS) level of less than 0.1 parts per billion (ppb) and a perfluorooctanoic acid (PFOA) level of less than 0.2 parts per billion (ppb) and wherein the plasma is formed at a continuous power setting.

2. The method of claim 1, wherein the polymeric coating has an oleophobicity level of 5 or 6.

3. The method of claim 1, wherein the polymeric coating comprises a polymer selected from a group consisting of:

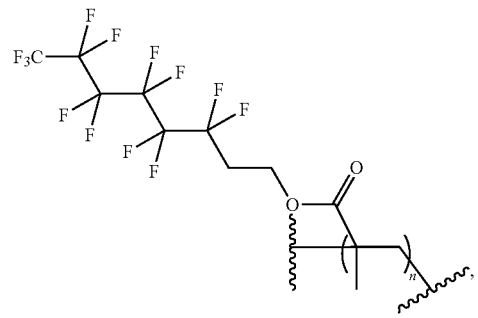

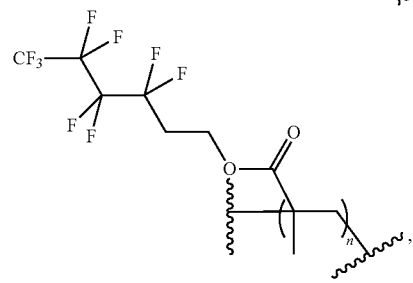

and
mixtures thereof, where n is from 2 to 100,000.

4. The method of claim 1, further comprising introducing the compound in a plasma chamber at a flow rate from about 30 cm$^3$/min to about 50 cm$^3$/min, prior to exposing the surface of the electronic device to the plasma comprising the compound.

5. The method of claim 1, wherein the plasma is a low pressure plasma of less than 1000 mTorr.

6. The method of claim 1, wherein at least a portion of the device is opened prior to exposing the surface to the plasma.

7. The method of claim 1, further comprising cleaning, etching, or activating the electronic device prior to exposing the surface to the plasma.

8. The method of claim 1, further comprising degassing the electronic device prior to exposing the surface to the plasma.

9. The method of claim 1, wherein the plasma is formed at a pressure between about 10 mTorr and about 1000 mTorr, at a temperature of about 5° C. to about 200° C., and at a frequency of about 20 kHz to about 2.45 GHz, and at a power setting from about 5 W and about 5000 W.

10. The method of claim 1, wherein the plasma is formed at a pressure between about 20 mTorr and about 60 mTorr.

11. The method of claim 1, wherein the plasma is formed at a temperature of about 40° C. to about 50° C.

12. The method of claim 1, wherein the plasma is formed at a frequency of about 12 MHz to about 15 MHz.

13. The method of claim 1, wherein the plasma is formed using a proximate electrode at a power setting ranging from about 0.017 to 0.023 W per cm$^2$.

14. The method of claim 1, wherein the polymeric coating is formed at a rate of about 25 to 75 nm of thickness on the electronic device per minute.

15. The method of claim 1, wherein the electronic device is selected from a group consisting of a cellular phone, a personal digital assistants (PDA), a computer, a tablet computer, a music player, a camera, a video recorder, a battery, an e reader, a radio device, and a gaming device.

16. The method of claim 1, wherein the step of exposing comprises:
placing the electronic device in a plasma chamber;
forming a continuous plasma in the plasma chamber in the presence of the compound to form a vaporized compound; and
contacting the vaporized compound with the surface of the electronic device, thereby forming the polymeric coating thereon.

17. A method of coating a surface of an electronic device, comprising:
exposing the surface of the electronic device to a plasma to form a polymeric coating comprising a polymer selected from a group consisting of:

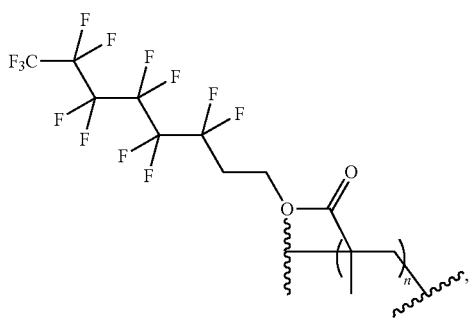

-continued

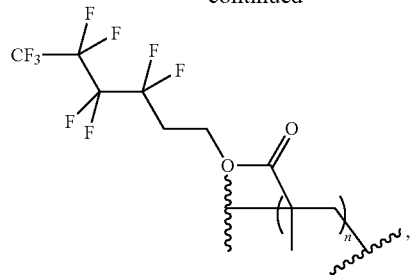

and
mixtures thereof, where n is from 2 to 100,000 and wherein the polymeric coating has a low toxicity level with a perfluorooctane sulfonate (PFOS) level of less than 0.1 parts per billion (ppb) and a perfluorooctanoic acid (PFOA) level of less than 0.2 parts per billion (ppb),
wherein the plasma comprising a compound with the following chemical formula:

$$CH_2=C(R_1)-COO-R_2$$

where $R_1$ includes —H or $CH_3$, $R_2$ includes —$(CH_2)_2$—$(CF_2)_m$—$CF_3$, and m is 3 or 5, so as to form a polymeric coating on the surface
placing the electronic device in one of a plurality of trays in a plasma chamber wherein each tray is proximate to a proximate electrode wherein each proximate electrode is connected to a power source, and generates plasma to encompass the contents of each tray,
introducing the compound into the plasma chamber through a control mechanism;
wherein the plasma is formed at a continuous power setting.

18. The method of claim 17, wherein the polymeric coating has an oleophobicity level of at least 5.

19. The method of claim 17, wherein the polymeric coating has an oleophobicity level of 5 or 6.

20. The method of claim 17, wherein the polymeric coating is formed at a rate of about 25 to 75 nm of thickness on the electronic device per minute.

21. The method of claim 17, wherein the electronic device is selected from a group consisting of a cellular phone, a personal digital assistants (PDA), a computer, a tablet computer, a music player, a camera, a video recorder, a battery, an e reader, a radio device, and a gaming device.

22. The method of claim 17, wherein the plasma is formed at a power setting ranging from about 0.017 to 0.023 W per cm$^2$ of the proximate electrode.

23. The method of claim 1 wherein the polymeric coating has a final thickness between 250 nm and 500 nm.

24. The method of claim 1, wherein the tray has a length and a thickness and the proximate electrode has a length and a thickness and wherein the length tray is equal to the length of the proximate electrode.

25. The method of claim 17 wherein the polymeric coating has a final thickness between 250 nm and 500 nm.

26. The method of claim 17, wherein the tray has a length and a thickness and the proximate electrode has a length and a thickness and wherein the length tray is equal to the length of the proximate electrode.

* * * * *